(12) United States Patent
Pohl et al.

(10) Patent No.: US 10,567,191 B2
(45) Date of Patent: Feb. 18, 2020

(54) FIELDBUS MODULE AND METHOD FOR OPERATING A FIELDBUS SYSTEM

(71) Applicant: BECKHOFF AUTOMATION GMBH, Verl (DE)

(72) Inventors: Christopher Pohl, Verl (DE); Jens Sachs, Petershagen (DE); Thomas Rettig, Rheda-Wiedenbrück (DE)

(73) Assignee: Beckhoff Automation GmbH, Verl (DE)

(*) Notice: Subject to any disclaimer, the term of this patent is extended or adjusted under 35 U.S.C. 154(b) by 0 days.

(21) Appl. No.: 16/213,844

(22) Filed: Dec. 7, 2018

(65) Prior Publication Data

US 2019/0109726 A1    Apr. 11, 2019

Related U.S. Application Data

(63) Continuation of application No. PCT/EP2017/063854, filed on Jun. 7, 2017.

(30) Foreign Application Priority Data

Jun. 9, 2016 (DE) .................. 10 2016 110 641

(51) Int. Cl.
*H04L 12/40* (2006.01)
*G05B 9/02* (2006.01)
(Continued)

(52) U.S. Cl.
CPC .......... *H04L 12/40* (2013.01); *G01R 19/0084* (2013.01); *G05B 9/02* (2013.01);
(Continued)

(58) Field of Classification Search
CPC .............. H04L 12/40; H04L 12/40013; H04L 12/40026; H04L 12/40045;
(Continued)

(56) References Cited

U.S. PATENT DOCUMENTS

| 2006/0161359 A1* | 7/2006 | Lalla | ..................... G01D 9/005 702/65 |
|---|---|---|---|
| 2009/0105848 A1 | 4/2009 | El-Sayed | |

(Continued)

FOREIGN PATENT DOCUMENTS

| DE | 102006005632 A1 | 8/2007 |
|---|---|---|
| DE | 102007062919 A1 | 6/2009 |

(Continued)

*Primary Examiner* — Glenn A. Auve
(74) *Attorney, Agent, or Firm* — Dorsey & Whitney LLP

(57) ABSTRACT

A fieldbus system comprises a switching device, a control device and a fieldbus module connected to a first electrical supply voltage, wherein a value of the first electrical supply voltage is ascertained and transmitted to a control device by the fieldbus module, wherein the ascertained value of the first electrical supply voltage is compared with a predetermined value of the first electrical supply voltage by the control device, wherein, if the value of the first electrical supply voltage that is transmitted to the control device is not concordant with the predetermined value of the first electrical supply voltage, shutdown of a second electrical supply voltage by the switching device is initiated by the control device.

18 Claims, 2 Drawing Sheets

(51) Int. Cl.
*G05B 19/042* (2006.01)
*G01R 19/00* (2006.01)
*G08C 19/02* (2006.01)
*H04L 12/66* (2006.01)
*H05K 7/14* (2006.01)

(52) U.S. Cl.
CPC ......... *G05B 19/0425* (2013.01); *G08C 19/02* (2013.01); *H04L 12/66* (2013.01); *H05K 7/1472* (2013.01)

(58) Field of Classification Search
CPC . H04L 2012/40221; H04L 2012/40228; H04L 2012/40234; H04L 2012/40241; G01R 19/0084; G05B 9/02; G05B 19/0425; G05K 7/1472
See application file for complete search history.

(56) References Cited

U.S. PATENT DOCUMENTS

| | | | |
|---|---|---|---|
| 2009/0315395 | A1* | 12/2009 | Rogoll .................. H02J 1/108 307/23 |
| 2014/0225589 | A1 | 8/2014 | Menge |
| 2014/0253008 | A1* | 9/2014 | Sykes .................. H02H 3/24 318/494 |
| 2014/0349157 | A1* | 11/2014 | Lang .................. H01M 10/425 429/90 |

FOREIGN PATENT DOCUMENTS

| | | |
|---|---|---|
| DE | 102011084688 A1 | 4/2013 |
| DE | 102013105994 A1 | 12/2014 |
| DE | 112014001538 T5 | 12/2015 |
| EP | 1312991 A2 | 5/2003 |
| EP | 2778811 A1 | 9/2014 |

* cited by examiner

… (1 / 5)

FIELDBUS MODULE AND METHOD FOR OPERATING A FIELDBUS SYSTEM

CROSS-REFERENCE TO RELATED APPLICATIONS

This application is a continuation of PCT Application No. PCT/EP2017/063854, filed Jun. 7, 2017 and entitled FELDBUSMODUL UND VERFAHREN ZUM BETREIBEN EINES FELDBUS SYSTEMS, which claims priority to German Patent Application No. 10 2016 110 641.0, filed Jun. 9, 2016 and entitled FELDBUSMODUL UND VERFAHREN ZUM BETREIBEN EINES FELDBUS SYSTEMS, each of which are incorporated by reference herein, in their entirety and for all purposes.

FIELD

The invention relates to a fieldbus module. The invention additionally relates to a fieldbus system. The invention additionally relates to a method for operating a fieldbus system.

BACKGROUND

The patent application claims the priority of the German patent application 10 2016 110 641.0, the content of which is included to the full extent in the disclosure of the present application by way of back-reference.

In automation engineering, fieldbus systems are used to control automation processes in installations having components in a distributed arrangement. The fieldbus systems comprise a fieldbus connecting a central control unit to for the most part multiple input/output modules in a distributed arrangement. Inputs of the input/output modules have the sensing system connected to them, and outputs of the input/output modules have the actuating system of the fieldbus system connected to them. In this case, the sensing system comprises all sensors that sense the state of the automation process to be controlled. The actuating system comprises all actuators that can alter the state of the process to be controlled.

The fieldbus normally comprises a data transmission medium, for example a network connection, by which data are interchanged between the control unit and the input/output modules. To control the automation process, the input/output modules use their inputs to read in input signals from the sensing system, the input signals representing the measured values captured by the sensors. The input/output modules convert the input signals into input data that are subsequently transmitted to the control unit via the fieldbus. The control unit performs a logic function on the input data in order to generate output data for controlling the automation process by the actuating system. The output data are transmitted from the control unit to the input/output modules via the fieldbus and converted by the input/output modules into output signals that are output via the outputs of the input/output modules in order to actuate the actuators.

In the case of fieldbus systems in safety-critical installations, it is frequently necessary to be able to put outputs of input/output modules into a safe state. The safe state in this case is a state in which it is ensured that the parts of the installation that are driven by the actuators cannot endanger the operating personnel or damage the installation. For the most part, the safe state is the "deenergized" or "zero voltage" or "zero current" state, in which the actuators are no longer supplied with drive power.

In the case of safety-critical installations, the control process that puts the outputs into the safe state must itself be implemented in safe fashion. In particular, special protective measures need to ensure that the safe state is also actually adopted and is subsequently not left again. Normally, the actuating system is put into the safe state by specific safety input/output modules.

SUMMARY

The present invention provides an improved fieldbus system, an improved fieldbus module and an improved method.

EXAMPLES

According to a first aspect, a fieldbus system comprises a switching device, a control device and a fieldbus module connected to a first electrical supply voltage, wherein a value of the first electrical supply voltage is ascertained and transmitted to a control device by the fieldbus module, wherein the ascertained value of the first electrical supply voltage is compared with a predetermined value of the first electrical supply voltage by the control device, wherein, if the value of the first electrical supply voltage that is transmitted to the control device is not concordant with the predetermined value of the first electrical supply voltage, shutdown of a second electrical supply voltage by the switching device is initiated by the control device.

According to a second aspect, a fieldbus module for a fieldbus system comprising a control device, comprises a port by which the fieldbus module is connectable to a first electrical supply voltage and to a second electrical supply voltage and also to a data bus of the fieldbus system at the same time, a voltage measuring device by which a value of the first electrical supply voltage is ascertainable, a communication device by which the ascertained value of the first electrical supply voltage is transmittable to the control device of the fieldbus system via the data bus, wherein the voltage measuring device and the communication device are supplied with electrical energy from the second electrical supply voltage, so that the value of the first electrical supply voltage is ascertainable and transmittable to the control device after shutdown of the second electrical supply voltage.

According to a third aspect a method for operating a fieldbus system, comprising: ascertaining a value of a first electrical supply voltage by a fieldbus module of the fieldbus system, transmitting the ascertained value of the first electrical supply voltage from the fieldbus module to a control device, and shutting down a second electrical supply voltage by the control device in the event of the transmitted value of the first electrical supply voltage not being concordant with a predetermined value of the first electrical supply voltage.

BRIEF DESCRIPTION OF THE DRAWINGS

The invention is explained in greater detail below on the basis of preferred exemplary embodiments with reference to figures, in which.

DETAILED DESCRIPTION

Figure 1:
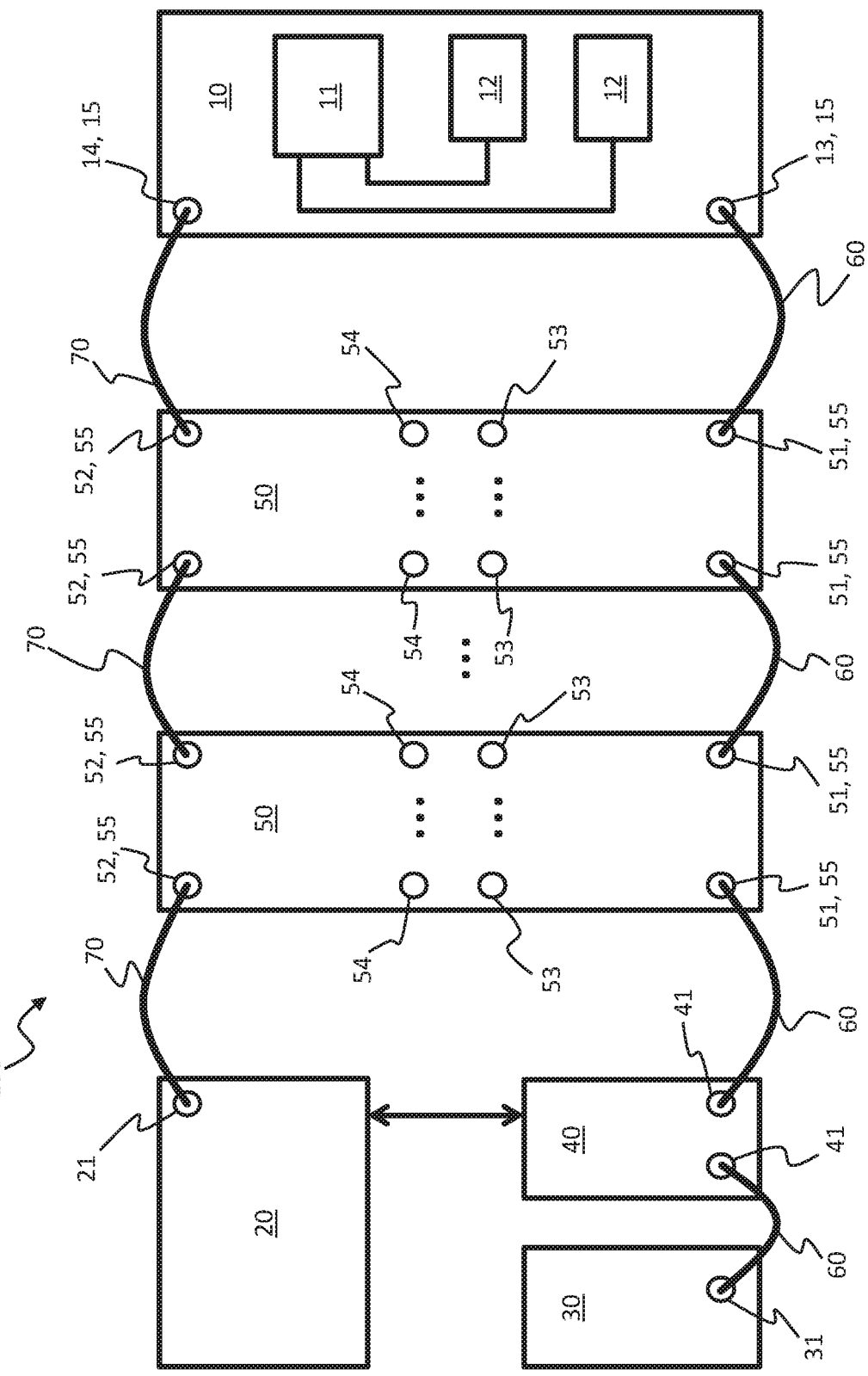
FIG. 1 shows a highly simplified basic block diagram of a fieldbus system with an embodiment of the fieldbus module.

A fieldbus module for arrangement at the end of a safety-critical section of a fieldbus system is intended to be used to ensure that a supply of electric power to all of the components of the section is provided in a safe manner. This is achieved by virtue of an evaluation of an electrical supply voltage being performed and being transmitted to a control device more or less in real time. The control device performs monitoring and evaluation of the transmitted values using actually requested and predetermined values. As a result, the control device can initiate necessary steps. In particular, after shutdown of the voltage supply for safety-critical parts of the fieldbus system, for example for safety-critical actuators, the fieldbus module can safely monitor an absence of voltage in the actuators.

A fieldbus system may have:
  a switching device for switching a first electrical supply voltage and a second electrical supply voltage,
  a control device for controlling the switching of the electrical supply voltages by the switching device, wherein the control device is connectable to a data bus of the fieldbus system via a bus contact system, and
  a fieldbus module connectable by a port to the first electrical supply voltage, the second electrical supply voltage and the data bus of the fieldbus system, wherein
  a value of the first electrical supply voltage is ascertainable and transmittable to the control device via the data bus by the fieldbus module, wherein
  the ascertained value of the first electrical supply voltage is comparable with a predetermined value of the first electrical supply voltage by the control device, wherein
  if the value of the first electrical supply voltage that is transmitted to the control device is not concordant with the predetermined value of the first electrical supply voltage, shutdown of the second electrical supply voltage by the switching device is initiable by the control device.

The fieldbus module for ascertaining the value of the first supply voltage advantageously allows a fault in an electrical supply for components of the fieldbus system to be safely detected and the fieldbus system to be put into a safe state. This allows, by way of example, a fault to be detected that results in shutdown of the first supply voltage failing, for example in the event of the two electrical supply voltages being bypassed, and the components powered from the first supply voltage still being supplied with power despite shutdown of the first voltage supply.

By way of example, actuators of the fieldbus system can be supplied with electrical energy from the first electrical supply voltage and communication units and/or sensors of the fieldbus system can be supplied with electrical energy from the second electrical supply voltage. In particular, the actuators may be safety-critical components of the fieldbus system. When communication units and/or sensors on one side and actuators on the other side are supplied with electrical energy separately, this brings about the technical advantage, in particular, that the supply of electrical energy to the actuators can be trimmed to safely shut down the actuating system, which automatically puts the outputs into a safe state. At the same time, the separate supply of energy means that the functionality of the sensing system and/or of the communication via the data bus can be maintained, as a result of which a non-safety-critical remainder of the installation can be transferred to a suitable state.

It is thus feasible for the input/output modules that can be used for the connection of sensors and/or actuators in the fieldbus system to be standard components that are not equipped for safety engineering purposes and allow inexpensive realization of a safety-critical fieldbus system. Also, the available product range of input/output modules is normally much more extensive in the case of standard components.

A fieldbus module for a fieldbus system comprising a control device, may have:
  a port by which the fieldbus module is connectable to a first electrical supply voltage, to a second electrical supply voltage and to a data bus of the fieldbus system, wherein
  a value of the first electrical supply voltage is ascertainable by the fieldbus module, and wherein
  the ascertained value of the first electrical supply voltage is transmittable to the control device of the fieldbus system via the data bus.

The transmission of the value of the first electrical supply voltage to the control device brings about the technical advantage, in particular, that the control device can detect that a fault has occurred, for example in the form of bypassing of the two electrical supply voltages. In this case, the control device can initiate a total shutdown of all electrical supply voltages, as a result of which the whole fieldbus system can be put into a safe state.

A method for operating a fieldbus system may have the steps of:
  supplying electric power to at least one input/output module of the fieldbus system by a first electrical supply voltage and a second electrical supply voltage,
  shutting down the first electrical supply voltage by a control device of the fieldbus system,
  ascertaining a value of the first electrical supply voltage by a fieldbus module,
  transmitting the ascertained value of the first electrical supply voltage from the fieldbus module to the control device, and
  shutting down the second electrical supply voltage by the control device in the event of the transmitted value of the first electrical supply voltage not being concordant with a predetermined value of the first electrical supply voltage.

This brings about the advantage, in particular, that the shutdown of the first electrical supply voltage can be verified safely. If the shutdown of the first electrical supply voltage results in a fault occurring, for example in the form of crossfeed of the conductors for the first electrical supply voltage from the second electrical supply voltage, then this fault can be safely detected by the value reported back for the first electrical supply voltage, and the second electrical supply voltage can likewise be shut down.

One embodiment of the fieldbus system has an input/output module, wherein the input/output module has a port for connection to the first and second electrical voltage supplies and for connection to the data bus. Further, the input/output module has an output for actuating an actuator. The input/output module is configured to supply a communication device for data communication via the data bus with energy from the second electrical voltage supply and to supply the actuator with energy from the first electrical voltage supply. The input/output module is arranged between the control device and the fieldbus module, and the first and second electrical voltage supplies are carried in turn from the switching device via the input/output module to the fieldbus module. The data bus is routed in turn from the control device via the input/output module to the fieldbus module.

As the input/output module, the actuator and the communication device are each supplied with energy from separate supply voltages, the actuator can advantageously be isolated by shutting down the first electrical supply voltage, while the communication device of the input/output module continues to be supplied with electrical energy from the second electrical voltage supply. This still allows data communication on the data bus to be maintained even when there is no current flowing through the actuators.

As the input/output module is arranged between the control device having the switching device and the fieldbus module, and the first and second electrical voltage supplies are carried in turn from the switching device via the input/output module to the fieldbus module, the voltage supply for the input/output module can advantageously be safely monitored by the fieldbus module.

If multiple input/output modules are connected to the data bus, then the fieldbus module may be connected to the data bus downstream of the input/output modules as the last bus component, for example. In this case, all input/output modules are situated between the switching device and the fieldbus module, and the first and second electrical voltage supplies are carried in turn from the switching device via the input/output modules to the fieldbus module. As a result, it is possible for the supply of all input/output modules with the first electrical supply voltage to be monitored by the fieldbus module arranged at the end of the data bus.

In one embodiment of the fieldbus system, the first and second electrical voltage supplies are carried between the switching device and the fieldbus module jointly in an electrical line. This advantageously reduces the number of lines to be routed between the switching device and the fieldbus module.

In one embodiment of the fieldbus system, the control device is configured to carry out the comparison between the value of the first electrical supply voltage that is ascertained by the fieldbus module and the predetermined value of the first electrical supply voltage after shutdown of the first electrical supply voltage by the switching device. The control device can advantageously take the transmitted value of the first electrical supply voltage as a basis for establishing whether the fieldbus components supplied with the first electrical supply voltage, in particular input/output modules arranged between the switching device and the fieldbus module, also actually have no current flowing through them after the first electrical supply voltage is shut down.

In one embodiment of the fieldbus system, the control device is configured to shut down the second electrical supply voltage if the value of the first electrical supply voltage that is ascertained by the fieldbus module is not received by the control device within a latency after shutdown of the first electrical supply voltage by the switching device. This advantageously ensures shutdown of the second electrical supply voltage even in fault situations in which the data communication between the fieldbus module and the control device is disrupted.

In one embodiment of the fieldbus system, the fieldbus module and the control device are configured to transmit the value of the first electrical supply voltage that is ascertained by the fieldbus module via a safe data channel via the data bus. This brings about the technical advantage, in particular, that a safety level for the whole fieldbus system is increased even further.

In one embodiment of the fieldbus system, the fieldbus module is configured as a safe component in order to capture the value of the first electrical supply voltage in a safe manner. In this manner, an interference immunity of the whole system may be increased again by virtue of ascertainment of the value of the first electrical supply voltage being performed redundantly, in particular. By way of example, this can be performed with an increased number of ascertainment elements, such as, for example, computer devices, voltage measuring devices, etc.

The terms "safe" and "safety", for example in connection with the expressions "safe components", "safe data channel", "capture in a safe manner" are used in the sense of safety in the manner in which they are defined in applicable machine guidelines, in particular EN IEC 62061:2013-09 and EN ISO 13849-1:2008. In particular, said terms are used to ensure a detectability of an event or state (e.g. whether a sensor is working properly, whether an electrical voltage is switched on or shut down, etc.) and to perform a process safely. In particular, the terms "safe" and "safety" cover devices and measures that detect the occurrence of faults, for example when capturing measured values, outputting control values or transmitting and processing said values, and take suitable measures to protect the system in the event of a fault, that is to say when a fault occurs. Such measures can comprise shutting down drive energy, in particular.

The term "two channel system" can be regarded in this context as a way of achieving safety. Two channel systems and redundancy can be understood as a subset of the terms "safe operation" and "safety". By way of example, two channel systems capture, transmit or process data, measured values or control values by two parallel channels. Subsequently, the results of the two channels can be compared, with a disparity in the results indicating a fault.

In one embodiment of the fieldbus module, the port of the fieldbus module is configured for connection to a line carrying the first and second supply voltages jointly.

In one embodiment of the fieldbus module, the ascertained value of the first electrical supply voltage is transmittable to the control device via a safe data channel via the data bus.

In one embodiment of the fieldbus module, the value of the first electrical supply voltage is ascertainable in a safe manner.

One development of the method comprises supplying an actuator connected to the input/output module with energy from the first electrical voltage supply and supplying a communication device of the input/output module for data communication via the data bus with energy from the second electrical voltage supply. As a result, the actuator can advantageously be isolated by shutting down the first electrical voltage supply, while the communication device continues to be supplied with current. This allows communication via the data bus to be maintained even when the actuators have been shut down or have no current flowing through them, and allows measured values captured by input/output modules to be transmitted to a superordinate control unit via the data bus, for example.

One development of the method comprises shutting down the second electrical supply voltage by the control device if the value of the first electrical supply voltage that is ascertained by the fieldbus module has not been transmitted to the control device within a latency after the shutdown of the first electrical supply voltage.

In one development of the method, the ascertaining of the value of the first electrical supply voltage and the transmitting of the ascertained value of the first electrical supply voltage to the control device are repeated by the fieldbus module at periodic intervals. This advantageously continuously provides the control device with a present value of the first electrical supply voltage, so that the control device can react promptly to undesirable disparities in a first electrical supply voltage applied to the fieldbus module.

FIG. 1 shows a basic overview block diagram of an embodiment of a fieldbus system 100. The fieldbus system 100 comprises a control device 20, a data bus 70, a defined number of input/output modules 50 and a fieldbus module 10. The data bus 70 is configured using linear topology or open ring topology. In this case the control device 20 is arranged at the head or beginning of the data bus 70, so that the data bus 70 begins at the control device 20. Subsequently, the input/output modules 50 are connected to the data bus 70 in turn. At the end of the data bus 70, the fieldbus module 10 is connected to the data bus 70.

The input/output modules 50 have one or more inputs 54 for connection of sensors in FIG. 1 and have one or more outputs 53 for connection of actuators. In alternative embodiments of the fieldbus system 100, the input/output modules 50 can also have just one or more inputs and no outputs or just one or more outputs and no inputs. The inputs 54 and/or outputs 53 may be configured as digital or analog inputs and outputs that read in and provide a voltage, for example. The outputs 53 may also be configured as motor actuation units providing a regulated current for an electric motor, for example to generate high drive power.

The sensors may be temperature, pressure or contact sensors or may be light barriers, for example. The sensors can also sense safety-critical states of the automation process. In this case, they can sense whether a protective door of the controlled installation has been opened or an emergency off switch of the installation has been operated, for example.

The actuators may be relays, electrically controlled valves or may be electric motors, for example. The actuators can also move parts of the installation that can present a safety risk, for example a risk to operating personnel or the risk of damage to the installation. By way of example, the actuators can operate robots or presses or control heating elements.

The input/output modules 50 are configured to use the data bus 70 to send input data to a superordinate control unit and to receive output data from the superordinate control unit. The input and output data all together form process data for controlling the automation process.

The data bus 70 may be configured as a fieldbus. The data bus 70 may be based or founded on the Ethernet protocol. The data bus 70 may be configured as a real time-compatible data bus for which a data transmission between two units or modules connected to the data bus 70 takes place and is concluded within a prescribed interval of time. In particular, the data bus 70 may be based on the EtherCAT protocol, the Profibus protocol or the Interbus protocol.

For the purpose of data interchange, a data packet can be transmitted from the control device 20 via the data bus 70, containing the output data for the input/output modules 50. The data packet can pass through the input/output modules 50 on the data bus 70 in turn, the input/output modules 50 each taking the output data intended for them from the data packet and inserting the input data generated by them into the data packet. Once the data packet has reached the fieldbus module 10 arranged at the end of the data bus 70, it can pass through the input/output modules 50 on the data bus 70 in the reverse order back to the control device 20.

The fieldbus system 100 depicted in FIG. 1 may be part of a larger control system. The control system can comprise the superordinate control unit for controlling the automation process. As part of the control, the superordinate control unit can logically combine the input data and generate the output data. The superordinate control unit can interchange the input and output data with the control device 20, for example via a further data bus. In this case, the further data bus and the data bus 70 can also form a shared or contiguous data bus.

By way of example, the superordinate control unit can generate a data packet that is transmitted first of all to the control device 20 and subsequently to the input/output modules 50 and the fieldbus module 10. Alternatively, the control device 20 may also be configured to generate a data packet for transmitting the input and output data. Alternatively or additionally, the control device 20 may also be configured to control the automation process fully or in part by logically combining input data and producing output data. In this case, the superordinate control unit may be arranged in the control device 20.

The control device 20 is functionally connected to a switching device 40. An electrical supply device 30 uses an output 31 to supply multiple components of the fieldbus system 100 with two different electrical supply voltages $U_P$, $U_S$. In this case, a first electrical supply voltage $U_P$ and a second electrical supply voltage $U_S$ are carried from the output 31 of the supply device 30 to the switching device 40, to the input/output modules 50 and to the fieldbus module 10 in turn.

The fieldbus module 10 has a port 15 for connection to the first electrical supply voltage $U_P$, the second electrical supply voltage $U_S$ and the data bus 70. The port 15 comprises a bus contact system 14, by which the signals of the data bus 70 are transmitted, and a voltage contact system 13, by which the first and second electrical supply voltages $U_P$, $U_S$ are transmitted.

The voltage contact system 13 connects the fieldbus module 10 to an electrical line 60 carrying both the first electrical supply voltage $U_P$ and the second electrical supply voltage $U_S$. The electrical line 60 can comprise multiple electrical conductors insulated from one another. By way of example the conductors may be combined in a shared casing. Alternatively or additionally, the electrical line 60 and the ports 15, 55 may also be realized using plug connectors between the input/output modules 50 and the fieldbus module 10. By way of example, plug connectors may be arranged on each of the outsides of the input/output modules 50 and the fieldbus module 10 such that the plug connectors are electrically conductively connected to one another when the modules are arranged in succession to one another, for example on a top-hat rail or terminal strip. The electrical line 60 may also be realized using different connection techniques between the individual modules, for example both using conductors combined in a shared casing and using plug connectors.

The first and the second electrical supply voltages $U_P$, $U_S$ can each be transmitted on separate conductors or wires of the electrical line 60. By way of example, the first and second electrical supply voltages $U_P$, $U_S$ can each be transmitted on DC isolated conductor pairs, one conductor of each of the conductor pairs being a ground conductor. For the connection to the line 60, the voltage contact system 13 can comprise one contact per conductor, for example four contacts.

The bus contact system 14 connects the fieldbus module 10 to the data bus 70. For the data transmission, the data bus 70 can comprise multiple conductors. In particular, the data bus 70 can comprise one or more conductor pairs for the data transmission. By way of example, the data bus 70 can comprise two differential conductor pairs that can be referred to as Rx+/Rx− and Tx+/Tx−, for example. The bus contact system 14 can have one contact per conductor, for example the bus contact system 14 can have a total of four contacts for the connection of two conductor pairs.

The contacts of the voltage contact system 13 of the port 15 and of the bus contact system 14 of the port 15 may each be arranged in separate contact units, for example in separate plug connectors, on the fieldbus module 10. In an alternative embodiment of the fieldbus system 100 and of the port 15, the contacts of the voltage contact system 13 for the first electrical supply voltage $U_P$, the contacts of the voltage contact system 13 for the second electrical supply voltage $U_S$ and the contacts of the bus contact system 14 may also each be arranged in separate contact units. In a further alternative embodiment of the fieldbus system 100 and of the fieldbus module 10, the contacts of the port 15, that is to say both the contacts of the voltage contact system 13 and the contacts of the bus contact system 14, may also be configured in combination in a contact unit on the fieldbus module 10. By way of example the conductors of the electrical line 60 and of the data bus 70 may be carried in a shared casing and connected to the shared contact unit.

In an alternative embodiment of the fieldbus system 100 and of the fieldbus module 10, the same conductors of the line can be used for the data bus 70 and the electrical line 60. By way of example, the data bus 70 can comprise two conductor pairs, for example an (Rx+/Rx−) conductor pair and a (Tx+/Tx−) conductor pair, for the data transmission, and the first supply voltage $U_P$ can be transmitted via one of the conductor pairs and the second electrical supply voltage $U_S$ can be transmitted via the other of the conductor pairs. In this case, the port 15 of the fieldbus module can comprise a contact unit having four contacts to which the four conductors of the two conductor pairs are connected.

Within the fieldbus module 10, the signals of the data bus 70 that are applied to the contacts and the first and second voltage supplies $U_P$, $U_S$, which are likewise applied to the contacts, can be isolated from one another, for example by a high pass filter for the signals of the data bus 70 and a low pass filter for the first and second voltage supplies $U_P$, $U_S$. The signals of the data bus 70 and the first and second supply voltages $U_P$, $U_S$ can be carried, for example based on the EtherCAT P standard, together on conductors of a shared line having a shared casing comprising the data bus 70 and the line 60.

The input/output modules 50 have a port 55 that connects them to the data bus 70, to the first voltage supply $U_P$ and to the second voltage supply $U_S$. The port 55 of the input/output modules 50 is configured like the port 15 of the fieldbus module. In particular, the port 55 comprises a voltage contact system 51 configured like the voltage contact system 13 of the fieldbus module 10, and a bus contact system 52 configured like the bus contact system 14 of the fieldbus module 10. The voltage contact system 51 and the bus contact system 52 can in particular comprise one or more contact units, each having one or more contacts.

The control device 20 is connected to the data bus 70 via a bus contact system 21. The bus contact system 21 of the control device 20 may be configured like the bus contact systems 52, 14 of the input/output units 50 and/or of the fieldbus module 10. The switching device 40 is connected to the output 31 of the supply device 30 and to the line 60 via a voltage contact system 41. The voltage contact system 41 of the switching device 40 may be configured like the voltage contact systems 51, 13 of the input/output units 50 and/or of the fieldbus module 10.

The control device 20 and the switching device 40 may be arranged in a shared housing. The voltage contact system 41 of the switching device 40 and the bus contact system 21 of the control device 20 may be configured so as to be together like the ports 51, 52 of the input/output units 50 and/or the port 15 of the fieldbus module 10.

To transmit the data via the data bus 70, the input/output modules 50, the fieldbus module 10 and the control device 20 have communication devices connected to the data bus 70 via the bus contact systems 21, 52, 14. By way of example, the communication devices can comprise protocol chips implementing a protocol used for the communication on the fieldbus. By way of example, the communication devices can comprise EtherCAT protocol chips.

The first electrical supply voltage $U_P$ is provided for supplying electric power to the actuating system connected to the outputs 53 of the input/output modules 50 and the second electrical supply voltage $U_S$ is provided for supplying electric power to the sensing system connected to the inputs 54 of the input/output modules 50. Additionally or alternatively, the communication devices of the input/output modules 50 that control the interchange of the process data via the data bus 70, and/or computer units of the input/output modules 50 that perform the conversion between the input and output signals and the process data, inter alia, can also be supplied with electrical energy from the second electrical supply voltage $U_S$. The second electrical supply voltage $U_S$ can also feed only the communication devices and/or the computer units, while the sensing system is supplied with power from another voltage source.

For the electrical supply voltages $U_P$, $U_S$, low electrical safety voltages having a voltage level of less than 150 V can be used, for example at 48 V or 24 V for each of the two electrical supply voltages $U_P$, $U_S$ or 48 V for the first electrical supply voltage $U_P$ and 24 V for the second electrical supply voltage $U_S$.

The outputs 53 of the input/output modules 50 are used to actuate safety-critical actuators, such as, for example, machines or production machines having protective doors that must always be closed in the course of operation of the installations, at the first electrical supply voltage $U_P$. Thus, the portion of the data bus 70 depicted in FIG. 1 between the control device 20 having the switching device 40 and the fieldbus module 10 altogether forms a safety-critical section of the fieldbus system 100. When a safety-critical event occurs, for example when a protective door protecting the installation is opened or when an emergency off switch is operated, it is necessary to ensure that the safety-critical actuators are transferred to a safe, for example zero-current, state.

By way of example, the control device 20 may be configured as a safe control device and, as such, be a safe component of the fieldbus system 100. In particular, the control device 20 may be configured to detect faults in the data transmitted to it and to ensure correct processing and output of data. To this end, the control device 20 can have redundant processing channels, for example, the results of which are compared with one another. In particular, the control device 20 can comply with the standards IEC 62061, ISO 13849-1 and/or IEC 61508.

The control device 20 is intended to control the switching device 40 in a safe manner, with safe switching-on and shutdown of the electrical supply voltages $U_P$, $U_S$ being performed. This can involve the shutdown being controlled by safe components, in particular, for example via redundant processing channels. It is also possible for a switch position for shutting down the supply voltages $U_P$, $U_S$ to be sensed and reported back to the control device 20, for example via redundant processing and signal channels.

The safe switching-on and shutdown of the electrical supply voltages $U_P$, $U_S$ provides for the occurrence of a safety-relevant event (for example the opening of a protected door of a production machine) to first of all result in the first electrical supply voltage $U_P$ for the actuators of the system being shut down. In this case, the second electrical supply voltage $U_S$ for the sensors still remains switched on in order to be able to continue to observe and monitor a system response of the fieldbus system 100 via the connected sensing system.

The shutdown of the first electrical supply voltage $U_P$ can be triggered in this case as a reaction to process data that signal the onset of the safety-critical event. The process data can be generated by input/output modules 50 arranged in the section of the fieldbus system 100 that is depicted in FIG. 1, or else in a portion of the fieldbus system 100.

The shutdown of the first electrical supply voltage $U_P$ isolates the outputs 53 of the input/output modules 50 and the actuators connected to the outputs 53. The installation controlled via the fieldbus system 100 may be configured such that the safe state of the installation is the zero-current state of the actuators. In this case, the installation is fundamentally transferred to the safe state by the safe shutdown of the first electrical supply voltage $U_P$.

So that the safe shutdown of the first electrical supply voltage $U_P$ by the control device 20 and the switching device 40 also reliably results in the safe state of the installation, however, it is necessary to ensure that after the shutdown of the first electrical supply voltage $U_P$ the portions of the line 60 that carry the first electrical supply voltage $U_P$ are also actually free of voltage.

During operation of the fieldbus system 100, damage to the line 60 can occur before or after shutdown of the first electrical supply voltage $U_P$, however, resulting in an already shut-down first electrical supply voltage $U_P$ being electrically shorted or crossfed by the second electrical supply voltage $U_S$ in an undesirable manner, as may be the case with a damaged line 60 on account of external mechanical action on the line 60.

It is also possible for faults or damage in the input/output modules 50 to result in the portions of the line 60 that carry the first electrical supply voltage $U_P$ having a voltage applied to them even when the first electrical supply voltage $U_P$ has been shut down, for example by virtue of relevant portions of the line 60 being crossfed from the second electrical supply voltage $U_S$. In these cases, despite the first electrical supply voltage $U_P$ having been shut down, a voltage level is still present on the conductors of the first electrical supply voltage $U_P$, which can bring about undesirable and safety-critical effects on the connected actuating system.

To detect these faults, the fieldbus module 10 is connected to the system at the end of the safety-critical section of the fieldbus system 100 and performs a monitoring function for said first electrical supply voltage $U_P$, as explained in more detail below. The fieldbus module 10 is provided for detecting and ascertaining a present value of the first electrical supply voltage $U_P$. The fieldbus module 10 has a voltage measuring device 12 that is configured to measure the value of the first electrical supply voltage $U_P$ applied to the voltage contact system 13 of the fieldbus module 10. The voltage measuring device 12 may be configured as an analog/digital converter or as a comparator, for example.

The fieldbus module 10 is further configured to report back the value of the first electrical supply voltage $U_P$ ascertained by the voltage measuring device 12 to the control device 20. The fieldbus module 10 has a computer device 11, for example in the form of a microprocessor or an FPGA, which receives a signal transmitted by the voltage measuring device 12 and converts it into information data representing the ascertained voltage value.

The value of the first electrical supply voltage $U_P$ ascertained by the fieldbus module 10 is transmitted to the control device 20 via the data bus 70. To this end, the fieldbus module 10 comprises a communication device that negotiates the connection to the data bus 70. The communication device of the fieldbus module 10 may be configured like the communication devices of the input/output units 50. The communication device and the components of the fieldbus module 10 that are needed for ascertaining the value of the first electrical supply voltage $U_P$, that is to say the computer device 11 and the voltage measuring device 12, for example, are supplied with electrical energy from the second electrical supply voltage $U_S$ applied to the voltage contact system 13.

By way of example, the communication device may be configured to insert the information data representing the ascertained value of the first electrical supply voltage into the data packet circulating on the data bus 70. By way of example, the data packet may be a data telegram, for example an EtherCAT data telegram. By way of example, the communication device can comprise an EtherCAT protocol chip.

The control device 20 is configured to compare the value of the first electrical supply voltage $U_P$ transmitted by the fieldbus module 10 with a predetermined value of the first electrical supply voltage $U_P$. In particular, the control device 20 may be configured to verify whether the transmitted value of the first electrical supply voltage $U_P$ is concordant with the predetermined value of the first electrical supply voltage $U_P$. The predetermined value of the first electrical supply voltage $U_P$ may in this case be dependent on a switching state of the switching device 40, in particular. When a shutdown is performed, it is thus expected that the first electrical supply voltage $U_P$ is no longer applied to the voltage contact system 13 of the fieldbus module 10, that is to say that the predetermined value is zero.

In an open position of the switching device 40, the predetermined value may be the voltage value of the first electrical supply voltage $U_P$ that is provided by the electrical supply device 30. In this case, the predetermined value may also be lower by a difference amount than the voltage value provided by the electrical supply device 30, for example in order to allow for voltage losses as a result of a line resistance between the electrical supply device 30 and the fieldbus module 10.

If the value transmitted by the fieldbus module 10 is not consistent with the predetermined value of the first electrical supply voltage $U_P$, a fault is assumed that, for example, may be present after shutdown of the first electrical supply voltage $U_P$ in the form of the aforementioned cross feed of the conductors for the first electrical supply voltage $U_P$ of the line 60. In the event of a fault, the control device 20 initiates shutdown of the second electrical supply voltage $U_S$ so that it cannot continue to cross feed the conductors for the first electrical supply voltage $U_P$. As a result, this shuts down the entire supply of electric power for all input/output modules 50 of the fieldbus system 100, which puts the system into a safe, i.e. deenergized or zero-current or zero-voltage state.

If, by contrast, the value of the first electrical supply voltage $U_P$ transmitted by the data bus 70 after the first electrical supply voltage $U_P$ is shut down by the switching device 40 is identical to the expected value of the first electrical supply voltage $U_P$, that is to say that correct shutdown of the first electrical supply voltage $U_P$ has taken place, then no change is made to the electrical feed for the fieldbus system 100. This means that the second electrical supply voltage $U_S$ continues to remain switched on even after the first electrical supply voltage $U_P$ is shut down by the switching device 40.

The fieldbus module 10 may be configured to transmit the value of the first electrical supply voltage $U_P$ to the control device 20 periodically at fixed intervals of time. Alternatively, the fieldbus module 10 may also be configured to transmit the value of the first electrical supply voltage $U_P$ to the control device 20 under event control, for example after a drop in the first electrical supply voltage $U_P$ below a prescribed limit value.

The value of the first electrical supply voltage $U_P$ can be transmitted to the control device 20 in a safe manner, so that faults during the transmission of the value of the first electrical supply voltage $U_P$ to the control device 20 can be detected safely. In this case, the value of the first electrical supply voltage $U_P$ can be transmitted via a safe transmission channel realized on the data bus 70, for example.

By way of example, the fieldbus module 10 and the control device 20 can each have safety components realizing the safe transmission channel. By way of example, the safety components can implement a safety protocol for detecting faulty or absent transmission of the value of the first electrical supply voltage $U_P$ via the data bus 70. By way of example, the safety protocol may be the Failsafe over EtherCAT (FSoE) protocol or the PROFIsafe protocol. Alternatively or additionally, the value ascertained by the fieldbus module 10 can also be transmitted via a separately routed data cable instead of via the data bus 70.

The control device 20 may be configured to compare the value of the first electrical supply voltage $U_P$ that is transmitted by the fieldbus module 10 when the first electrical supply voltage $U_P$ is switched on with the predetermined value. In this case, by way of example, the control device 20 can verify that the first electrical supply voltage $U_P$ does not fall below a value below which the actuators connected to the input/output modules 50 can no longer be operated safely or reliably. The control device 20 may be configured to shut down the first electrical supply voltage $U_P$ and/or the second electrical supply voltage $U_S$ if the comparison results in a low value of this kind for the first electrical supply voltage $U_P$.

The fieldbus module 10 may be configured to measure not only the first electrical supply voltage $U_P$ but also the second electrical supply voltage $U_S$ and to transmit the value thereof to the control device 20. As a result, the control device 20 can also detect a drop in the second electrical supply voltage $U_S$. If the second electrical supply voltage $U_S$ falls below a critical value, for example to values at which reliable operation of the sensors and/or reliable data communication by the data bus 70 is no longer ensured, the control device 20 can put the actuators into a safe state by using the switching device 40 to shut down the first and/or second electrical supply voltage $U_P$, $U_S$.

As a result, it is thus possible for inexpensive standard modules requiring no complex safety upgrade to be used for the input/output modules 50.

As a result, this supports inexpensive realization of a safety-critical fieldbus system section.

As a result, this allows different safety levels for the entire safety-critical fieldbus system 100 and/or for a larger fieldbus system comprising the fieldbus system 100.

A further-increased safety level can be realized by virtue of the fieldbus module 10 also being used to perform the ascertainment of the first electrical supply voltage $U_P$ in a safe manner. By way of example, this can be effected by virtue of the fieldbus module 10 being configured as a safe component of the fieldbus system 100 and, by way of example, having a redundant arrangement of multiple computer devices 11 and/or voltage measuring devices 12 for measuring the first electrical supply voltage $U_P$. Alternatively, redundancy within the fieldbus module 10 can also be realized by a redundant multichannel software architecture for processing the measured values and for generating the data to be transmitted to the control device 20.

As a result, a safely ascertained value of the first electrical supply voltage $U_P$ can be safely captured and transmitted to the control device 20 at the greatest possible safety level.

There may be provision for a latency to be defined or to be made variable, within which the value of the ascertained first electrical supply voltage $U_P$ needs to have been transmitted from the fieldbus module 10 to the control device 20 since the shutdown of the first electrical supply voltage $U_P$. If the control device 20 does not receive a value of the first electrical supply voltage $U_P$ ascertained by the fieldbus module 10 within the predefined latency after the shutdown of the first electrical supply voltage $U_P$, then the control device 20 can prompt the switching device 40 to safely shut down the second electrical supply voltage $U_S$ too.

By way of example, the latency can be stipulated on the basis of certification guidelines that stipulate a time specification to which the system can be matched. By way of example, the latency may be proportioned to be greater than or equal to that period of time within which the value of the first electrical supply voltage $U_P$ that is ascertained in the fieldbus module 10 is transmitted to the control device 20 via the data bus 70. In this manner, flexible usability of the system is possible.

If the fieldbus system 100 is part of a larger fieldbus system having a superordinate control unit for controlling the automation process, then the fieldbus system 100 beginning at the control device 20 can form a subsystem having, in particular, safety-critical outputs within the entire fieldbus system. The control device 20, the electrical supply device 30 and the switching device 40 may be arranged together in an intermediate or feed module connected between the superordinate control unit and the input/output modules 50 having the safety-critical outputs 53 in order to supply the input/output modules 50 with the electrical supply voltages $U_P$ and $U_S$. Alternatively, such an intermediate module can also comprise just the control device 20 and the switching device 40, but not the electrical supply device 30. In such a case, the first and second electrical supply voltages $U_P$ and $U_S$ are supplied to the feed module separately, for example together with the data bus 70 to the superordinate control unit in a single cable.

In a further alternative embodiment of the fieldbus system 100, functions of the electrical supply device 30 and of the switching device 40 may also be realized together in one device. By way of example, the control device 20 for shutting down the first electrical supply voltage $U_P$ can also safely shut down the portion of the electrical supply device 30 that generates the first electrical supply voltage $U_P$.

In alternative embodiments of the fieldbus system 100, the control device 20 and the switching device 40 may also be functionally connected to one another via the data bus 70, for example via a safe data channel on the data bus 70. In further alternative embodiments of the fieldbus system 100, some of the input/output modules 50 may also have non-safety-critical outputs that do not need to be transferred to the deenergized state, that is to say can continue to be operated, in the event of a fault. In the fieldbus system 100, a third electrical voltage supply can be provided that supplies power to the non-safety-critical outputs of the input/output modules 50 and, in the event of a fault, continues to supply power even after shutdown of the first electrical supply voltage $U_P$.

Figure 2:
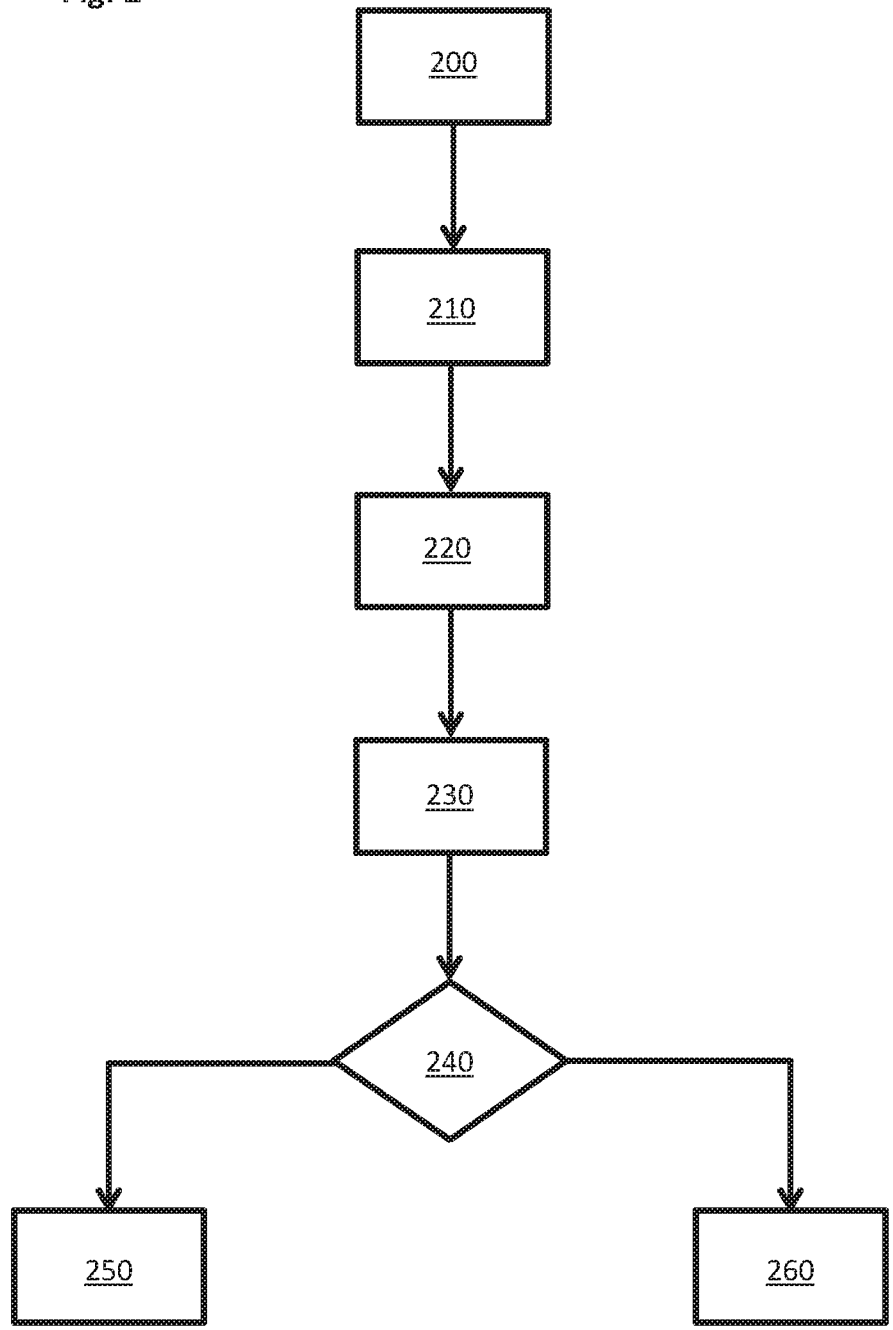
FIG. 2 shows a basic, highly simplified cycle of an embodiment.

FIG. 2 shows a basic overview image of a flowchart for an embodiment of the method for operating a fieldbus system 100.

In a step 200, a supply of electric power to at least one input/output module 50 of the fieldbus system 100 is performed using two electrical supply voltages $U_P$, $U_S$.

In a step 210, shutdown of a first electrical supply voltage $U_P$ is performed. By way of example, the first electrical supply voltage $U_P$ can be used for supplying power to the actuating system of the fieldbus system 100.

In a step 220, ascertainment of a value of the first electrical supply voltage $U_P$ is performed by a fieldbus module 10.

In a step 230, transmission of the ascertained value of the first electrical supply voltage $U_P$ to a control device 20 is performed.

In a step 240, comparison of the transmitted value of the first electrical supply voltage $U_P$ with a predetermined value of the first electrical supply voltage $U_P$ is performed. The predetermined value may be 0 V, for example.

If it is established in step 240 that the transmitted value of the first electrical supply voltage $U_P$ is not concordant with the predetermined value of the first electrical supply voltage $U_P$, shutdown of a second electrical supply voltage $U_S$ is performed in a step 250. By way of example, the second electrical supply voltage $U_S$ can be used to supply power to a sensing system of the fieldbus system 100 and/or to supply power to communication devices of the input/output modules 50 or of the fieldbus module 10.

If it is established in step 240 that the transmitted value of the first electrical supply voltage $U_P$ is concordant with the predetermined value of the first electrical supply voltage $U_P$, supply of the second electrical supply voltage $U_S$ to the fieldbus system 100 is performed in a step 260.

In one development of the method for operating a fieldbus system 100, the method can comprise, after step 210 for shutting down the first electrical supply voltage $U_P$, verification of whether or not a predetermined latency has elapsed. If step 230 for receiving the ascertained value of the first electrical supply voltage $U_P$ has not been carried out by the time the latency has elapsed, step 250 for shutting down the second electrical supply voltage $U_S$ can be performed directly as a further step.

In summary, a kind of "diagnosis box" allows a status of an electrical supply voltage to be detected and transmitted to a control device in safety-critical applications of automation engineering. In reaction to the reporting of the diagnosis box, the control device 20 can initiate the suitable steps and hence allow safe operation of the safety-critical applications, because freedom from perturbations is provided between the two electrical supply voltages.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

What is claimed is:

1. A fieldbus system comprising:
a switching device,
a control device,
a fieldbus module connected to a first electrical supply voltage,
wherein a value of the first electrical supply voltage is ascertained and transmitted to the control device by the fieldbus module, wherein the ascertained value of the first electrical supply voltage is compared with a predetermined value of the first electrical supply voltage by the control device, and
wherein, if the value of the first electrical supply voltage that is transmitted to the control device is not concordant with the predetermined value of the first electrical supply voltage, shutdown of a second electrical supply voltage by the switching device is initiated by the control device.

2. The fieldbus system according to claim 1,
wherein the switching device switches the first electrical supply voltage and the second electrical supply voltage,
wherein the control device controls the switching of the electrical supply voltages by the switching device,
wherein the control device is connected to a data bus of the fieldbus system via a bus contact system,
wherein the fieldbus module is connected by a port to the first electrical supply voltage and to the second electrical supply voltage and also to the data bus of the fieldbus system at the same time, and
wherein the value of the first electrical supply voltage is ascertained and transmitted to the control device via the data bus by the fieldbus module, wherein the ascertained value of the first electrical supply voltage is comparable with the predetermined value of the first electrical supply voltage by the control device,
wherein, if the value of the first electrical supply voltage that is transmitted to the control device is not concordant with the predetermined value of the first electrical supply voltage, the shutdown of the second electrical supply voltage by the switching device is initiated by the control device.

3. The fieldbus system according to claim 1, having an input/output module,
wherein the input/output module has a port for connection to the first and second electrical voltage supplies and for connection to a data bus,
wherein the input/output module has an output for actuating an actuator,
wherein the input/output module is configured to supply a communication device of the input/output module for data communication via the data bus with energy from the second electrical voltage supply and the actuator with energy from the first electrical voltage supply,
wherein the input/output module is arranged between the control device and the fieldbus module,
wherein the first and second electrical voltage supplies are carried from the switching device via the input/output module to the fieldbus module, and
wherein the data bus is routed from the control device via the input/output module to the fieldbus module.

4. The fieldbus system according to claim 1, wherein the first and second electrical voltage supplies are carried between the switching device and the fieldbus module jointly in an electrical line.

5. The fieldbus system according to claim 1, wherein the control device is configured to carry out the comparison between the value of the first electrical supply voltage that is ascertained by the fieldbus module and the predetermined value of the first electrical supply voltage after shutdown of the first electrical supply voltage by the switching device.

6. The fieldbus system according to claim 5, wherein the control device is configured to shut down the second electrical supply voltage if the value of the first electrical supply voltage that is ascertained by the fieldbus module is not received by the control device within a latency after shutdown of the first electrical supply voltage by the switching device.

7. The fieldbus system according to claim 1, wherein the fieldbus module and the control device are configured to transmit the value of the first electrical supply voltage that is ascertained by the fieldbus module via a safe data channel via a data bus.

8. The fieldbus system according to claim 1, wherein the fieldbus module is configured as a safe component in order to capture the value of the first electrical supply voltage in a safe manner.

9. A fieldbus module for a fieldbus system comprising a control device, the fieldbus module comprising:
   a port by which the fieldbus module is connectable to a first electrical supply voltage and to a second electrical supply voltage and also to a data bus of the fieldbus system at the same time,
   a voltage measuring device by which a value of the first electrical supply voltage is ascertainable,
   a communication device by which the ascertained value of the first electrical supply voltage is transmittable to the control device of the fieldbus system via the data bus, and
   wherein the voltage measuring device and the communication device are supplied with electrical energy from the second electrical supply voltage, so that the value of the first electrical supply voltage is ascertainable and transmittable to the control device after shutdown of the second electrical supply voltage.

10. The fieldbus module according to claim 9, wherein the port of the fieldbus module is configured for connection to a line carrying the first and second supply voltages jointly.

11. The fieldbus module according to claim 9, wherein the ascertained value of the first electrical supply voltage is transmittable to the control device via a safe data channel via the data bus.

12. The fieldbus module according to claim 9, wherein the value of the first electrical supply voltage is ascertainable in a safe manner.

13. A method for operating a fieldbus system comprising:
   ascertaining a value of a first electrical supply voltage by a fieldbus module of the fieldbus system,
   transmitting the ascertained value of the first electrical supply voltage from the fieldbus module to a control device, and
   shutting down a second electrical supply voltage by the control device in the event of the transmitted value of the first electrical supply voltage not being concordant with a predetermined value of the first electrical supply voltage.

14. The method according to claim 13, further comprising
   supplying electric power to at least one input/output module of the fieldbus system by the first electrical supply voltage and the second electrical supply voltage,
   shutting down the first electrical supply voltage by a control device of the fieldbus system,
   ascertaining a value of the first electrical supply voltage by a fieldbus module,
   transmitting the ascertained value of the first electrical supply voltage from the fieldbus module to the control device, and
   shutting down the second electrical supply voltage by the control device in the event of the transmitted value of the first electrical supply voltage not being concordant with a predetermined value of the first electrical supply voltage.

15. The method according to claim 13, wherein the method comprises the further steps of:
   supplying an actuator connected to an input/output module with energy from the first electrical supply voltage, and
   supplying a communication device of the input/output module for data communication via the data bus with energy from the second electrical supply voltage.

16. The method according to claim 15, wherein the ascertaining of the value of the first electrical supply voltage and the transmitting of the ascertained value of the first electrical supply voltage to the control device are repeated by the fieldbus module at periodic intervals.

17. The method according to claim 13, further comprising shutting down the second electrical supply voltage by the control device if the value of the first electrical supply voltage that is ascertained by the fieldbus module has not been transmitted to the control device within a latency after shutdown of the first electrical supply voltage.

18. The method according to claim 17, wherein the ascertaining of the value of the first electrical supply voltage and the transmitting of the ascertained value of the first electrical supply voltage to the control device are repeated by the fieldbus module at periodic intervals.

\* \* \* \* \*